(12) United States Patent
Shen et al.

(10) Patent No.: US 10,750,072 B2
(45) Date of Patent: *Aug. 18, 2020

(54) CAMERA MODULE AND PHOTOSENSITIVE ASSEMBLY THEREOF

(71) Applicant: NANCHANG O-FILM OPTICAL-ELECTRONIC TECH CO., LTD., Nanchang (CN)

(72) Inventors: Chengzhe Shen, Nanchang (CN); Jun Feng, Nanchang (CN); Shumin Zhu, Nanchang (CN); Shengyun Zhang, Nanchang (CN); Wenhua Shuai, Nanchang (CN); Dong Tang, Nanchang (CN)

(73) Assignee: NANCHANG O-FILM OPTICAL-ELECTRONIC TECH CO., LTD., Nanchang (CN)

( * ) Notice: Subject to any disclaimer, the term of this patent is extended or adjusted under 35 U.S.C. 154(b) by 28 days.

This patent is subject to a terminal disclaimer.

(21) Appl. No.: 16/132,379

(22) Filed: Sep. 15, 2018

(65) Prior Publication Data
US 2019/0089884 A1 Mar. 21, 2019

(30) Foreign Application Priority Data

Sep. 15, 2017 (CN) .......................... 2017 1 0853859

(51) Int. Cl.
*H04N 5/225* (2006.01)
*H01L 27/146* (2006.01)
(Continued)

(52) U.S. Cl.
CPC .......... *H04N 5/2257* (2013.01); *H01L 24/48* (2013.01); *H01L 27/14618* (2013.01);
(Continued)

(58) Field of Classification Search
CPC ............ H04N 5/2257; H01L 27/14618; H01L 31/0203; H01L 31/0236–02366
See application file for complete search history.

(56) References Cited

U.S. PATENT DOCUMENTS

2018/0007244 A1 1/2018 Wang et al.
2018/0035028 A1* 2/2018 Wang ................. G02B 19/0076
(Continued)

OTHER PUBLICATIONS

U.S. Office Action dated Oct. 7, 2019, issued on U.S. Appl. No. 16/132,295 in the name of Nanchang O-Film Optical-Electronic Tech Co., Ltd.
(Continued)

*Primary Examiner* — Paul M Berardesca
(74) *Attorney, Agent, or Firm* — Franklin & Associates Interntaional Inc; Matthew Lambrinos

(57) ABSTRACT

The present disclosure relates to a camera module and a photosensitive assembly thereof. The photosensitive assembly comprises includes a circuit board, a photosensitive chip, and a packaging body. The photosensitive chip is connected to the circuit board. The packaging body is formed on the circuit board. A through hole is formed in the packaging body. The through hole is opposite to the photosensitive chip to provide a light channel of for the photosensitive chip. An inner side surface of the through hole comprises includes a first cambered surface, a connection surface, and a second cambered surface, and the first cambered surface and the second cambered surface are respectively connected to two ends of the connection surface. In the photosensitive assembly, both the upper and lower ends or the inner side surface of the package are provided to as cambered surfaces, which facilitate the demolding of the molding device of the packaging body and avoids damage to the packaging body by the molding device in the demolding step.

10 Claims, 3 Drawing Sheets

(51) Int. Cl.
    *H01L 23/00*     (2006.01)
    *H05K 3/32*     (2006.01)
    *H05K 1/18*     (2006.01)

(52) U.S. Cl.
    CPC ........... *H04N 5/2253* (2013.01); *H05K 1/186* (2013.01); *H05K 3/32* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H05K 2201/10151* (2013.01); *H05K 2201/10977* (2013.01)

(56) References Cited

U.S. PATENT DOCUMENTS

| | | |
|---|---|---|
| 2019/0086771 A1 | 3/2019 | Shen et al. |
| 2019/0088698 A1 | 3/2019 | Shen et al. |
| 2019/0088699 A1 | 3/2019 | Shen et al. |
| 2019/0089881 A1 | 3/2019 | Shen et al. |
| 2019/0089882 A1 | 3/2019 | Shen et al. |
| 2019/0089883 A1 | 3/2019 | Shen et al. |
| 2019/0089885 A1 | 3/2019 | Shen et al. |
| 2019/0148429 A1 | 5/2019 | Wang et al. |
| 2019/0165019 A1 | 5/2019 | Wang et al. |

OTHER PUBLICATIONS

Non-Final Office Action dated Aug. 7, 2019 issued on U.S. Appl. No. 16/132,260 to Nanchang O-Film Optical-Electronic Tech Co., Ltd.

\* cited by examiner

CAMERA MODULE AND PHOTOSENSITIVE ASSEMBLY THEREOF

CROSS-REFERENCE TO RELATED APPLICATIONS

This application claims priority to Chinese Patent Application No. 201710853859.0, entitled "CAMERA MODULE AND PHOTOSENSITIVE ASSEMBLY THEREOF" filed Sep. 15, 2017, the contents of which is expressly incorporated herein by reference in its entirety.

TECHNICAL FIELD

The disclosure relates to the field of camera modules, and more particularly, to a camera module and a photosensitive assembly thereof.

BACKGROUND

With the rapid development of various smart devices, smart devices integrated with camera modules are developing towards thinner and lighter, while improving the imaging quality. The imaging quality is improved, with the result that both of the sizes and quantities of electronic components are getting larger, and the area of the photosensitive chip significantly affecting the imaging quality is also increasing. This causes more assembling difficulty of the camera module and larger sizes of the camera modules. Therefore, the lightening and thinning of the camera module is greatly limited, thereby limiting the size of the smart device provided with the camera module.

Generally, during the manufacturing of a camera module, a circuit board and a photosensitive chip are manufactured separately at first. Then the photosensitive chip is bonded to the circuit board, and finally the circuit board and the photosensitive chip are packaged together by a packaging body. Typically, a packaging body is made by an injection molding process, in which the top surface of the packaging body may be warped up by a molding device in a demolding step. This may reduce die imaging quality of die camera module.

SUMMARY

The present disclosure is intended to provide a high quality camera module and a photosensitive assembly thereof.

A photosensitive assembly is provided, including:
a circuit board;
a photosensitive chip connected to the circuit board; and
a packaging body formed on the circuit board, wherein a through hole is formed in the packaging body, the through hole is opposite to the photosensitive chip to provide a light channel for the photosensitive chip, an inner side surface of the through hole includes a first cambered surface, a connection surface, and a second cambered surface, and the first cambered surface and the second cambered surface are respectively connected to two ends of the connection surface.

In the above-mentioned photosensitive assembly, both the upper and lower ends of the Inner side surface of the packaging body are provided as cambered surfaces, which facilitate the demolding of the molding device of the packaging body and avoid damage to the packaging body during the demolding of the molding device.

In one embodiment the photosensitive chip includes a photosensitive region and a non-photosensitive region surrounding the photosensitive region, the packaging body is also packaged on the non-photosensitive region, the packaging body includes a top surface away from the photosensitive chip, an end of the first cambered surface away from the connection surface is connected to the non-photosensitive region, and an end of the second cambered surface away from the connection surface is connected to the top surface.

The packaging body extends to the non-photosensitive region of the photosensitive chip, so that the photosensitive chip is fixed on the circuit board by means of molding, which not only enhances the firmness of the connection between the photosensitive chip and the circuit board, but also increases the packaging area of the packaging body to enhance the firmness of the connection from the packaging body to the circuit board and photosensitive chip.

In one embodiment, the first cambered surface is a concave cambered surface, and the second cambered surface is a convex cambered surface. Compared with the inner side surface perpendicular to the photosensitive chip and passing through the end of the first cambered surface connected to the non-photosensitive region, the concave cambered surface can reduce the material requirement of the packaging body. Compared with the inner side surface perpendicular to the photosensitive chip and passing through the end of the first cambered surface away from the non-photosensitive region, the concave cambered surface can further increase the packaging area of the packaging body, thereby further enhancing the firmness of the connection between the packaging body and the photosensitive chip. Compared with the inner side surface perpendicular to the photosensitive chip and passing through the end of the second cambered surface away from the top surface, when the support device and the packaging body are bonded, the redundant adhesive can flow inward onto the cambered surface. The cambered surface has greater resistance to the flow of the adhesive than a vertical plane, which can reduce the flow velocity of the adhesive, so that the adhesive can be deposited on the cambered surface furthermore, the cambered surface has a larger surface area than the inclined plane and can carry more adhesive. In this way, it is possible to effectively prevent the adhesive from flowing to the photosensitive region of the photosensitive chip.

In one embodiment, the concave cambered surface is a circular cambered surface with a radius ranged from 20 to 200 μm. The above-mentioned radius configuration of the concave circular cambered surface takes into consideration both the firmness of the connection between the packaging body and photosensitive chip, and the material requirement of the packaging body.

In one embodiment, the radius of the concave cambered surface ranges from 50 to 150 μm.

In one embodiment, the radius of the concave cambered surface ranges from 80 to 120 μm.

In one embodiment, the convex cambered surface is a circular cambered surface with a radius ranged from 10 to 100 μm. The above-mentioned radius configuration of the convex circular cambered surface takes into consideration both the convenience of the demolding of the packaging body and the material requirement of the packaging body.

In one embodiment, the radius of the convex cambered surface ranges from 30 to 80 μm.

In one embodiment, the radius of the convex cambered surface ranges from 40 to 60 μm.

In one embodiment, the inner side surface further includes a connection surface connecting the first cambered surface and the second cambered surface. The connection surface can enhance the structural strength of the packaging body.

In one embodiment, the connection surface is perpendicular to the top surface, or an angle between the connection surface and the top surface is an obtuse angle. The connection surface is perpendicular to the top surface, which can enhance the structural strength of the packaging body. The angle between the connection surface and the top surface is an obtuse angle, which is more conducive to the demolding of the molding device of the packaging body, and can also reduce the amount of the reflected light of the incident light reflected to the photosensitive region of the photosensitive chip via the connection surface, thereby avoiding interference with the imaging effect and improving the imaging quality.

In one embodiment, a distance between the top surface and a surface of the photosensitive chip away from the circuit board ranges from 200 to 300 μm. The design of the depth of the packaging body on the photosensitive chip can meet both packaging requirements and miniaturization design of photosensitive assemblies.

In one embodiment, it further includes wires connecting the photosensitive chip and the circuit board, and the wires are capsuled in the packaging body. The wires are capsuled in the packaging body to prevent the wires from moving. Meanwhile, the wires are in a sealed environment, which can reduce the contact between the wires and the moisture in the air and extend the service life of the wires.

A camera module is also provided, including:

any one of the above-mentioned photosensitive assemblies; and a lens assembly arranged on the photosensitive assembly and facing to the photosensitive chip directly.

Since the photosensitive assembly is more easily to demold, the yield of the camera module including the photosensitive assembly is also increased, and the production cost is reduced.

DETAILED DESCRIPTION

For the convenience of understanding the present disclosure, embodiments of the disclosure are described more fully hereinafter with reference to the accompanying drawings. Preferable embodiments are presented in the accompanying drawings. However, the disclosure may be embodied in many different forms and is not limited to the embodiments described herein. Rather, these embodiments are provided so that the understanding of the disclosure of the present disclosure will be more thorough.

It should be understood that when an element is referred to as "fixed to" another element, it can be directly on the other element or an intervening element may also be present. When an element is referred to as being "connected" to another element, it can be directly connected to another element or an intervening element may also be present. The terms "vertical", "horizontal", "left", "right", and the like are used herein for an illustrative purpose only.

All technical and scientific terms used herein have the same meaning as commonly understood by one of ordinary skill in the art, unless otherwise defined. The terms used herein is for the purpose of describing embodiments only and is not intended to limit the present disclosure. As used herein, the term "and/or" includes any and all combinations of one or more of the associated listed items.

Figure 1:
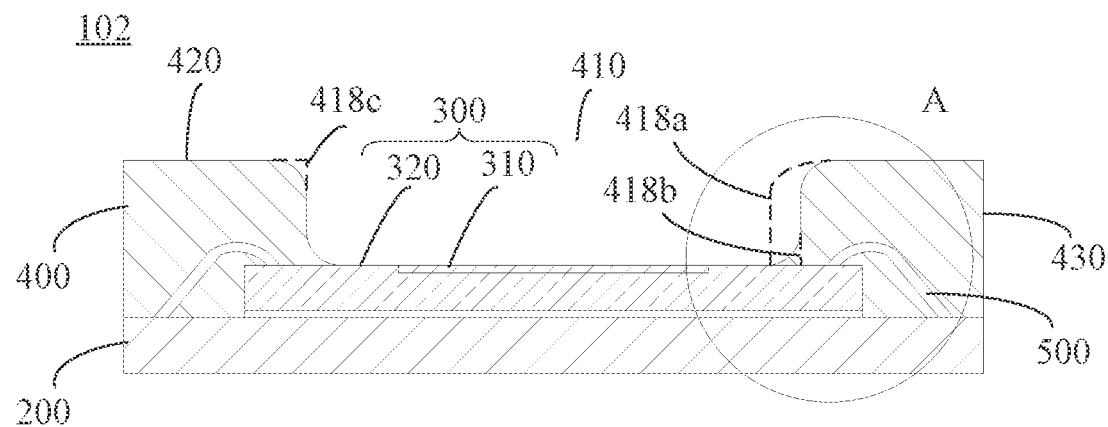
FIG. 1 is a schematic view of a photosensitive assembly according to a first embodiment of the present disclosure.
Figure 2:
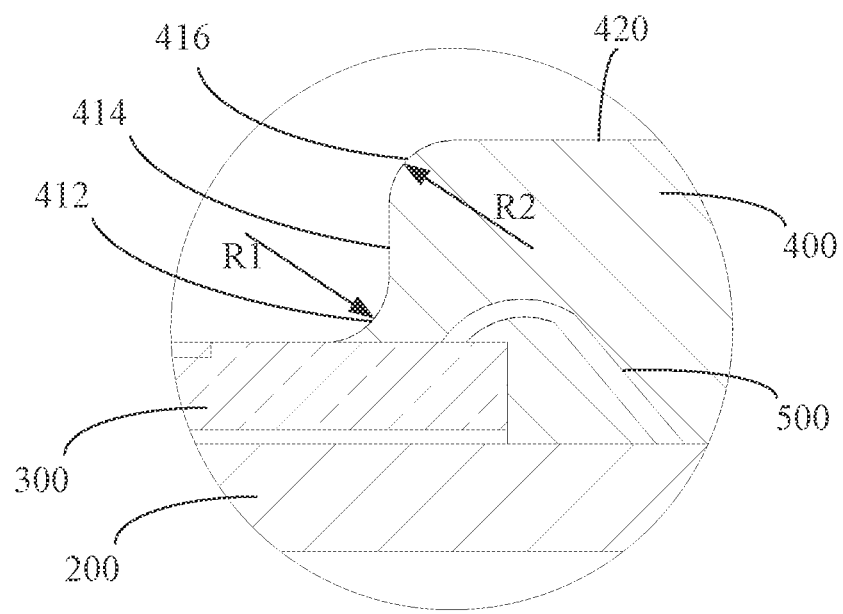
FIG. 2 is an enlarged view of a portion A in the photosensitive assembly of FIG. 1.

As shown in FIGS. 1 and 2, a photosensitive assembly 102 according to one embodiment includes a circuit board 200, a photosensitive chip 300, and a packaging body 400. The circuit board 200 may be a rigid circuit board, such as a ceramic circuit board, or may be a rigid-flexible circuit board or a flexible circuit board. If the circuit board 200 is the flexible circuit board, a reinforcing board (not shown) may be arranged on a side of the circuit board 200 away from the photosensitive chip 300 to reinforce the circuit board 200, thereby improving the overall structural strength of the photosensitive assembly 102. The photosensitive chip 200 is connected to the circuit board 200.

The packaging body 400 is formed on the circuit board 200. A through hole 410 is formed in the packaging body 400. The through hole 410 is opposite to the photosensitive chip 300 to provide a light channel for the photosensitive chip 300. An inner side surface of the through hole 450 includes a first cambered surface 412, a connection surface 414, and a second cambered surface 416. The first cambered surface 412 and the second cambered surface 416 are respectively connected to two ends of the connection surface 414.

In the photosensitive assembly 102 of this embodiment, both the upper and lower ends of the inner side surface of the packaging body 400 are provided as cambered surfaces, which can facilitate the demolding of the molding device of the packaging body 400 and avoid damage to the packaging body in the demolding step.

In this embodiment, the photosensitive chip 300 includes a photosensitive region 310 and a non-photosensitive region 320 surrounding the photosensitive region 310. The photosensitive region 310 is mainly made of a semiconductor material having photosensitive characteristics. A chemical change takes place in the photosensitive region 310 when the photosensitive region 310 is irradiated with light, and the photosensitive region 310 converts the light into an electrical signal, thereby realizing the transformation of the photoelectric signal, and finally completing the imaging. There is no chemical change taking place in the non-photosensitive region 320 even when the non-photosensitive region 320 is irradiated with light.

Also, the packaging body 400 is packaged on the non-photosensitive region 320. The packaging body 400 includes a top surface 420 away from the photosensitive chip 300. An end of the first cambered surface 412 away from the connection surface 414 is connected to the non-photosensitive region 320, and an end of the second cambered surface 416 away from the connection surface 414 is connected to the top surface 420.

For the photosensitive assembly 102 in this embodiment, the packaging body 400 extends to the photosensitive chip 300, so that the photosensitive chip 300 is fixed on the circuit board 200 by means of molding. While forming the packaging body 400, the connection of the photosensitive chip 300 to the circuit board 200 is completed, thereby enhancing the firmness of the connection between the photosensitive chip 300 and the circuit board 200.

Moreover, compared with the packaging body be spaced with the photosensitive chip, the packaging body 400 extending to the photosensitive chip 300 can increase the packaging area of the packaging body 400, and enhance the firmness of the connection between the packaging body 400 and the circuit board 200, and between the packaging body 400 and the photosensitive chip 300.

Furthermore, in this embodiment the non-photosensitive region 320 is partially embedded in the packaging body 400, so that the entire photosensitive region 310 can be used to sense light, thereby ensuring the largest photosensitive area of the photosensitive assembly 102. Moreover, compared with the packaging body 400 covering the entire non-photosensitive regions 320, the present disclosure can not only reduce the volume of the packaging body 400, but also reserve a portion of the non-photosensitive regions 320 to receive foreign materials, such as package resin. This can avoid reducing the image quality caused by the package resin or the like flowing into the photosensitive region 310 during the packaging process.

Figure 3:
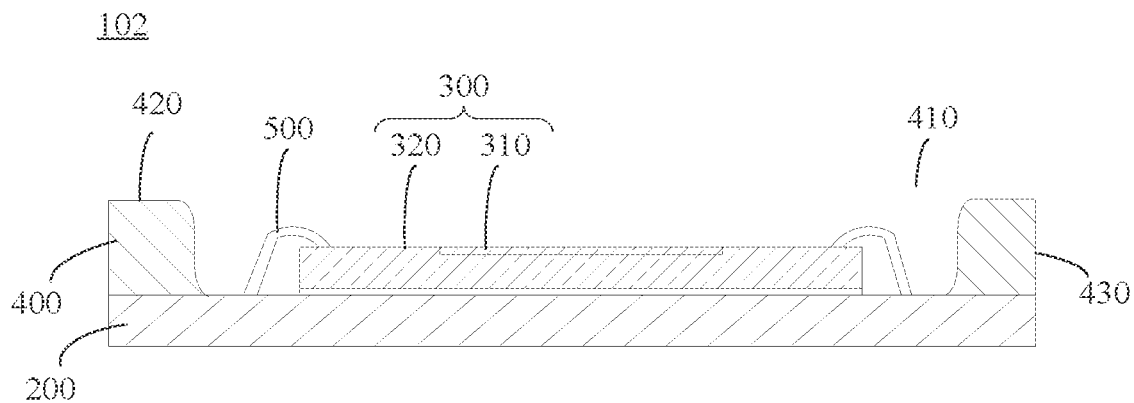
FIG. 3 is a schematic view of a photosensitive assembly according to a second embodiment of the present disclosure.

Of course, in other embodiments, as shown in FIG. 3, the packaging body 400 may also be spaced with the photosensitive chip 300, that is, the packaging body 400 is only packaged on the circuit board 200, and the end of the first cambered surface 412 away from the connection surface 414 is connected to the circuit board 200.

It is worth mentioning that the packaging body 400 is formed on the circuit board 200 and the photosensitive chip 300 by means of molding. For example, the packaging body 400 is formed by molding me circuit board 200 and the photosensitive chip 300 in an insert molding process by using an injection molding machine. The finished packaging body 400 is firmly connected to the circuit board 200 and the photosensitive chip 300. Each of the bonding force between the packaging body 400 and the circuit board 200 and between the packaging body 400 and the photosensitive chip 300 is much larger than the bonding force generated through the traditional way of bonding by adhesive layers. Specifically, the material for forming the packaging body 400 by an injection molding process may be nylon. LCP (Liquid Crystal Polymer) or PP (Polypropylene), etc. It will be understood by those skilled in the art that the foregoing alternative manufacturing methods and alternative materials are merely illustrative of the manner in which the disclosure can be implemented and are not intended to limit the disclosure.

In this embodiment, the first cambered surface 412 is a concave circular cambered surface, and the second cambered surface 416 is a convex circular cambered surface. That is, the first cambered surface 412 is formed by the recessing of the inner side surface of the through hole 410 toward the outer side surface 430 of the packaging body 400, and the second cambered surface 416 is formed by the protruding of the inner side surface of the through hole 410 away from the outer side surface 430 of the packaging body 400.

Compared with the inner side surface 418a (imaginary inner side surface) perpendicular to the photosensitive chip 300 and passing through the end of the first cambered surface 412 connected to the non-photosensitive region 320, the concave circular cambered surface can reduce the material requirement of the packaging body 400. Compared with the inner side surface 418a (an imaginary inner side surface) perpendicular to the photosensitive chip 300 and passing through an end of the first cambered surface 412 away from the non-photosensitive region 320, the concave cumbered surface can further increase the packaging area of the packaging body 400, thereby further enhancing the firmness of the connection between the packaging body 400 and the photosensitive chip 300. Compared with the inner side surface 418c (an imaginary inner side surface) perpendicular to the photosensitive chip 300 and passing through the end of the second cambered surface 416 away from the top surface 420, when the support device and the packaging body 400 are bonded, the redundant adhesive can flow inward onto the cambered surface. The cambered surface has greater resistance to the flow of the adhesive than a vertical plane, which can reduce the flow velocity of the adhesive. Thus the adhesive can be deposited on the cambered surface. Furthermore, the cambered surface has a larger surface area than the inclined plane, thereby carrying more adhesive. In this way, it is possible to effectively prevent the adhesive from flowing to the photosensitive region 310 of the photosensitive chip 300.

In one embodiment, the radius R1 of the concave circular cambered surface ranges from 20 to 220 μm.

In one embodiment the radius R1 of the concave circular cambered surface ranges from 50 to 150 μm.

In one embodiment, the radius R1 of the concave circular cambered surface ranges from 80 to 120 μm.

The configuration of the radius R1 of the concave circular cambered surface takes into consideration both the firmness of the connection between the packaging body 400 and photosensitive chip 300, and the material requirement of the packaging body 400. If the R1 is too large, the first cambered surface 412 is almost coincident with the side of the photosensitive chip 300 away from the circuit board 200, thereby increasing the difficulty of injection molding of the packaging body 400. The distance between the first cambered surface 412 and the photosensitive region 310 is very small, so that it is difficult to ensure that the photosensitive region 310 will not be contaminated by foreign matters, thereby affecting the imaging quality. If R1 is too small, the first cambered surface 412 is nearly perpendicular to the photosensitive chip 300, which cannot reduce the material requirement of the packaging body 400.

In one embodiment, the radius R2 of the convex circular cambered surface ranges from 10 to 100 μm.

In one embodiment, the radius R2 of the convex circular cambered surface ranges from 30 to 80 μm.

In one embodiment, the radius R2 of the convex circular cambered surface ranges from 40 to 60 μm.

The configuration of the radius R2 of the convex circular cambered surface takes into consideration both the convenience of the demolding of the packaging body 400 and the reduction of the material requirement of the packaging body 400. If R2 is too large, the second cambered surface 416 is almost coplanar with the top surface 420, which does not reduce the material requirement of the packaging body 400. If R2 is too small, the second cambered surface 416 is nearly perpendicular to the photosensitive chip 300, which is disadvantageous for the demolding of the molding device of the packaging body 400.

In one embodiment as shown in FIG. 2, the first cambered surface 412 is tangent to the side of the photosensitive chip 300 away from the circuit board 200, and is tangent to the connection surface 414. The second cambered surface 416 is tangent to both the connection surface 414 and the top surface 420 to ensure that the first cambered surface 412 is smoothly connected to the photosensitive chip 300, the first cambered surface 412 is smoothly connected to the connection surface 414, the connection surface 414 is smoothly connected to the second cambered surface 416, and the second cambered surface 416 is smoothly connected to the top surface 420, so that it further facilitates the demolding of the molding device of the packaging body 400, and avoids damage to the packaging body 400 by the molding device in the demolding step.

In one embodiment, as shown in FIGS. 1 and 2, the connection surface 414 is perpendicular to the top surface 420, thereby enhancing the structural strength of the packaging body 400.

Figure 4:
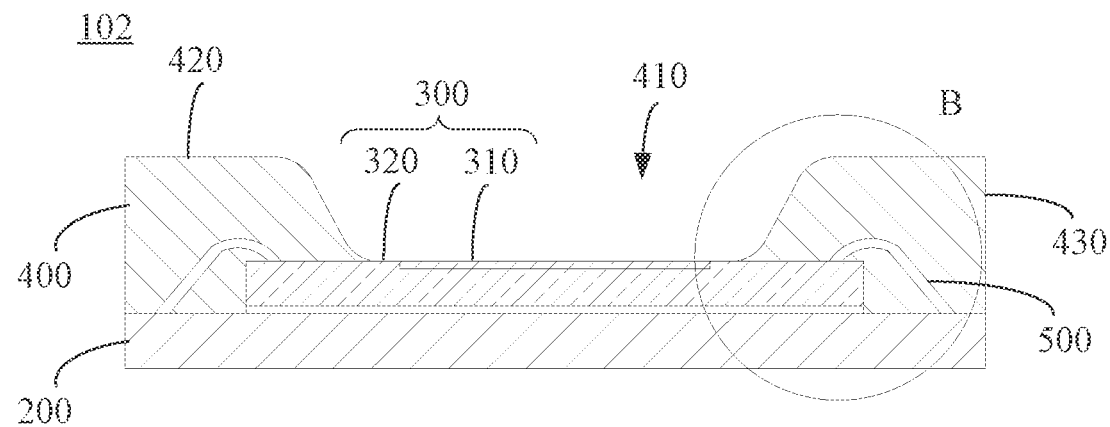
FIG. 4 is a schematic view of a photosensitive assembly according to a third embodiment of the present disclosure.
Figure 5:
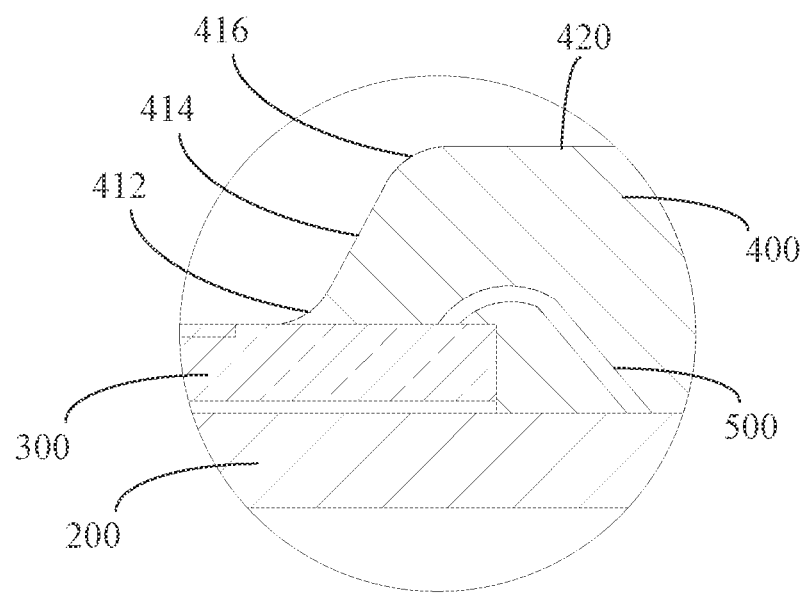
FIG. 5 is an enlarged view of a portion B in the photosensitive assembly of FIG. 4.

In one embodiment, as shown in FIGS. 4 and 5, the angle between the connection surface 414 and the top surface 420 is an obtuse angle. That is, the connection surface 414 is inclined toward the outer side surface 430. This can not only be more advantageous for the demolding of the molding device of the packaging body 400, but also reduce the amount of reflected light of the incident light reflected via the connection surface 414 to the photosensitive region 310 of the photosensitive chip 300, thereby avoiding interference with the imaging effect and improving the imagine quality.

In one embodiment, the top surface 420 is parallel to the upper surface of the photosensitive chip 300, and the vertical distance H (depth) between the top surface 412 and the upper surface of the photosensitive chip 300 ranges from 200 to 300 μm. The upper surface in this embodiment means a surface of the photosensitive chip 300 facing away from the circuit board 200. If the depth H of the packaging body 400 relative to the upper surface of the photosensitive chip 300 is smaller than 200 μm, the process of packaging the photosensitive chip 300 and other electronic elements on the circuit board 200 cannot be easily executed if the depth H of the packaging body 400 relative to the upper surface of the photosensitive chip 300 is larger than 300 μm, the depth of the camera module is markedly increased. This makes it difficult to apply the camera module to a slim electronic device such as a mobile phone. That is, the above-mentioned design of the depth H can meet both packaging requirements and miniaturization design.

In one embodiment, the photosensitive assembly 102 further includes wires 500 connecting the photosensitive chip 300 to the circuit board 200. The wires 500 are capsuled in the packaging body 400. That is, the wires 500 are completely housed in the packaging body 400. A material of the wires 500 may be selected from a group consisting of gold, copper, aluminum, silver and etc. The wires 500 are capsuled by the packaging body 400 to prevent the wires 500 from moving. Also, the wires 500 are in a sealed environment, thus the wires 500 hardly contact the moisture in the air, thereby extending the service life of the wires 500.

The present embodiment further provides a camera module, including the above-mentioned photosensitive assembly 102 and a lens assembly. The lens assembly is arranged above the photosensitive assembly 102 and aligned with the photosensitive chip 300 directly.

When a fixed focus lens is required the lens assembly includes a lens located above the top surface 416. When a zoom lens is required the lens assembly includes a lens, and a voice coil motor sleeved on the lens and located on the top surface 416. Light is transmitted to the photosensitive region 310 of the photosensitive chip 300 through the lens, and the photosensitive chip 300 converts an optical signal into an electrical signal.

The camera module includes a firmer photosensitive assembly 102, so that the camera module also becomes firmer. Since the success rate of the demolding of the molding device of the packaging body 400 on the photosensitive assembly 102 is higher, the production cost of the camera module is also reduced.

The technical features of the above-described embodiments may be combined arbitrarily. To simplify the description, all the possible combinations of the technical features in the above embodiments are not described. However, all of the combinations of these technical features should be considered as within the scope of the disclosure, as long as such combinations do not contradict with each other.

The above-described embodiments merely represent several embodiments of the present disclosure, and the description thereof is more specific and detailed, but it should not be construed as limiting the scope of the present disclosure. It should be noted that, for those skilled in the art, several variations and improvements may be made without departing from the concept of the present disclosure, and these are all within the protection scope of the present disclosure. Therefore, the scope of protection of the present disclosure shall be subject to the appended claims.

What claimed is:

1. A photosensitive assembly, comprising:
   a circuit board;
   a photosensitive chip connected to the circuit board; and
   a packaging body formed on the circuit board, wherein a through hole is formed in the packaging body, the through hole is opposite to the photosensitive chip to provide a light channel for the photosensitive chip, an inner side surface of the through hole comprises a first cambered surface, a connection surface, and a second cambered surface, and the first cambered surface and the second cambered surface are respectively connected to two ends of the connection surface;
   wherein the photosensitive chip comprises a photosensitive region and a non-photosensitive region surrounding the photosensitive region, the packaging body is also packaged on the non-photosensitive region, the packaging body comprises a top surface away from the photosensitive chip, an end of the first cambered surface away from the connection surface is connected to the non-photosensitive region, and an end of the second cambered surface away from the connection surface is connected to the top surface;
   wherein the first cambered surface is a concave cambered surface, and the second cambered surface is a convex cambered surface;
   wherein the connection surface is perpendicular to the top surface.

2. The photosensitive assembly of claim 1, wherein the concave cambered surface is a circular cambered surface with a radius ranged from 20 to 200 μm.

3. The photosensitive assembly of claim 2, wherein the radius of the concave cambered surface ranges from 50 to 150 μm.

4. The photosensitive assembly of claim 2, wherein the radius of the concave cambered surface ranges from 80 to 120 μm.

5. The photosensitive assembly of claim 1, wherein the convex cambered surface is a circular cambered surface with a radius ranged from 10 to 100 μm.

6. The photosensitive assembly of claim 5, wherein the radius of the convex cambered surface ranges from 30 to 80 μm.

7. The photosensitive assembly of claim 5, wherein the radius of the convex cambered surface ranges from 40 to 60 μm.

8. The photosensitive assembly of claim 1, wherein a distance between the top surface and a surface of the photosensitive chip away from the circuit board ranges from 200 to 300 μm.

9. The photosensitive assembly of claim 1, further comprising wires connecting the photosensitive chip and the circuit board, and the wires are capsuled in the packaging body.

10. A camera module, comprising:
   a photosensitive assembly according to claim 1; and
   a lens assembly mounted on the photosensitive assembly and located on a photosensitive path of the photosensitive chip.

\* \* \* \* \*